United States Patent
Lee (10) Patent No.: US 9,153,598 B2
(45) Date of Patent: Oct. 6, 2015

(54) MEMORY DEVICE COMPRISING A MEMORY CELL AND A SELECTION TRANSISTOR

(71) Applicant: SK hynix Inc., Gyeonggi-do (KR)

(72) Inventor: Seung Cheol Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/289,270

(22) Filed: May 28, 2014

(65) Prior Publication Data

US 2015/0187789 A1    Jul. 2, 2015

(30) Foreign Application Priority Data

Jan. 2, 2014  (KR) .................. 10-2014-0000235

(51) Int. Cl.
  H01L 27/00 (2006.01)
  H01L 27/115 (2006.01)
  H01L 21/28 (2006.01)
  H01L 27/06 (2006.01)

(52) U.S. Cl.
  CPC .... *H01L 27/11582* (2013.01); *H01L 21/28273* (2013.01); *H01L 27/0688* (2013.01); *H01L 27/1157* (2013.01); *H01L 27/11551* (2013.01); *H01L 27/11578* (2013.01)

(58) Field of Classification Search
  CPC ............... H01L 27/11578; H01L 27/0688; H01L 27/11551
  See application file for complete search history.

(56) References Cited

U.S. PATENT DOCUMENTS

| | | | | |
|---|---|---|---|---|
| 2009/0267135 | A1* | 10/2009 | Tanaka et al. | 257/324 |
| 2010/0213526 | A1* | 8/2010 | Wada et al. | 257/314 |
| 2011/0062510 | A1* | 3/2011 | Joo | 257/324 |
| 2012/0061744 | A1* | 3/2012 | Hwang et al. | 257/324 |
| 2014/0254231 | A1* | 9/2014 | Cernea et al. | 365/63 |
| 2014/0264525 | A1* | 9/2014 | Takahashi et al. | 257/314 |

FOREIGN PATENT DOCUMENTS

| | | |
|---|---|---|
| KR | 1020100093348 | 8/2010 |
| KR | 1020100098843 | 9/2010 |
| KR | 1020120041009 | 4/2012 |
| KR | 1020120113338 | 10/2012 |
| KR | 1020120121795 | 11/2012 |

* cited by examiner

*Primary Examiner* — Ngan Ngo
(74) *Attorney, Agent, or Firm* — IP & T Group LLP (57) ABSTRACT

A semiconductor device that includes a plurality of first conductive patterns stacked over a substrate, dummy patterns formed in the first conductive patterns, respectively, first barrier patterns each surrounding the respective first conductive patterns and partially interposed between the respective first conductive patterns and the respective dummy patterns, second barrier patterns each surrounding the respective first barrier patterns and the respective dummy patterns, a second conductive pattern located over or under the first conductive patterns, and a third barrier pattern surrounding the second conductive pattern, wherein the second conductive pattern has a greater thickness than the first conductive patterns.

7 Claims, 8 Drawing Sheets

MEMORY DEVICE COMPRISING A MEMORY CELL AND A SELECTION TRANSISTOR

CROSS-REFERENCE TO RELATED APPLICATION

The present application claims priority to Korean patent application number 10-2014-0000235 filed on Jan. 2, 2014, the entire disclosure of which is incorporated herein in its entirety by reference.

BACKGROUND

1. Field of Invention

Various exemplary embodiments of the present invention relate generally to an electronic device, and more particularly, to a semiconductor device and a method of manufacturing the same.

2. Description of Related Art

A non-volatile memory device preserves stored data even when the power is cut off. Two-dimensional memory devices in which memory cells are fabricated in a single layer over a silicon substrate have reached physical limits in increasing their degree of integration. Accordingly, three-dimensional (3D) non-volatile memory devices in which memory cells are stacked in a vertical direction over a silicon substrate have been proposed.

A 3D non-volatile memory device may include interlayer insulating layers and word lines stacked alternately and channel layers passing therethrough, in which memory cells may be stacked along the channel layers. In addition, when 3D non-volatile memory device are manufactured, the stacked word lines may be formed in such a manner that a plurality of oxide layers and a plurality of nitride layers may be alternately stacked, and the plurality of nitride layers may be replaced by a plurality of conductive layers.

However, it may be difficult to replace the plurality of nitride layers with the plurality of conductive layers, and neighboring layers may be damaged when the nitride layers are replaced by the conductive layers. Therefore, characteristics of the memory device may deteriorate.

SUMMARY

Exemplary embodiments of the present invention are directed to a semiconductor device that is easy to manufacture and has improved characteristics over conventional semiconductor devices, and a method for manufacturing the same.

A semiconductor device according to an embodiment of the present invention may include a plurality of first conductive patterns stacked over a substrate, dummy patterns formed in the first conductive patterns, respectively, first barrier patterns each surrounding the respective first conductive patterns and partially interposed between the respective first conductive patterns and the respective dummy patterns, second barrier patterns each surrounding the respective first barrier patterns and the respective dummy patterns, a second conductive pattern located over or under the first conductive patterns, and a third barrier pattern surrounding the second conductive pattern, wherein the second conductive pattern has a greater thickness than the first conductive patterns.

A semiconductor device according to an embodiment of the present invention may include a memory cell having a first channel layer, a dummy pattern surrounding a sidewall of the first channel layer, a first conductive pattern surrounding the dummy pattern, a first barrier pattern surrounding the first conductive pattern and partially interposed between the first conductive pattern and the dummy pattern, a second barrier pattern surrounding the first barrier pattern and the dummy pattern, and a selection transistor located over or under the memory cell and including a second channel layer, a second conductive pattern surrounding a sidewall of the second channel layer, and a third barrier pattern surrounding the second conductive pattern.

A method of manufacturing a semiconductor device according to an embodiment of the present invention may include forming a stacked structure having first material layers, at least one second material layer located over or under the first material layers, and third material layers interposed between the first and second material layers, forming a slit passing through the stacked structure, forming first and second openings by removing the first and second material layers through the slit, forming first sacrificial patterns in the first openings, and forming conductive layers in the first openings in which the first sacrificial patterns are formed, and in the second opening, wherein the second material layer has a greater thickness than the first material layers.

DETAILED DESCRIPTION

Various embodiments of the present disclosure will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, thicknesses and length of components are exaggerated for convenience of illustration. In the following description, a detailed explanation of known functions and constitutions may be omitted to avoid unnecessarily obscuring the subject manner of the present invention. Like reference numerals refer to like elements throughout the specification and drawings.

Furthermore, 'connected/coupled' represents that one component is directly coupled to another component or indirectly coupled through another component. In this specification, a singular form may include a plural form, and vice versa, as long as it is not specifically mentioned. Furthermore, 'include/comprise' or 'including/comprising' used in the specification represents that one or more components, steps, operations, and elements exist or are added.

It should be understood that the meaning of "on" and "over" in the present disclosure should be interpreted in the broadest manner so that "on" means not only "directly on" but also "on" something with an intermediate feature(s) or a layer(s) therebetween, and that "over" means not only directly on top but also on top of something with an intermediate feature(s) or a layer(s) therebetween.

Figure 1A:
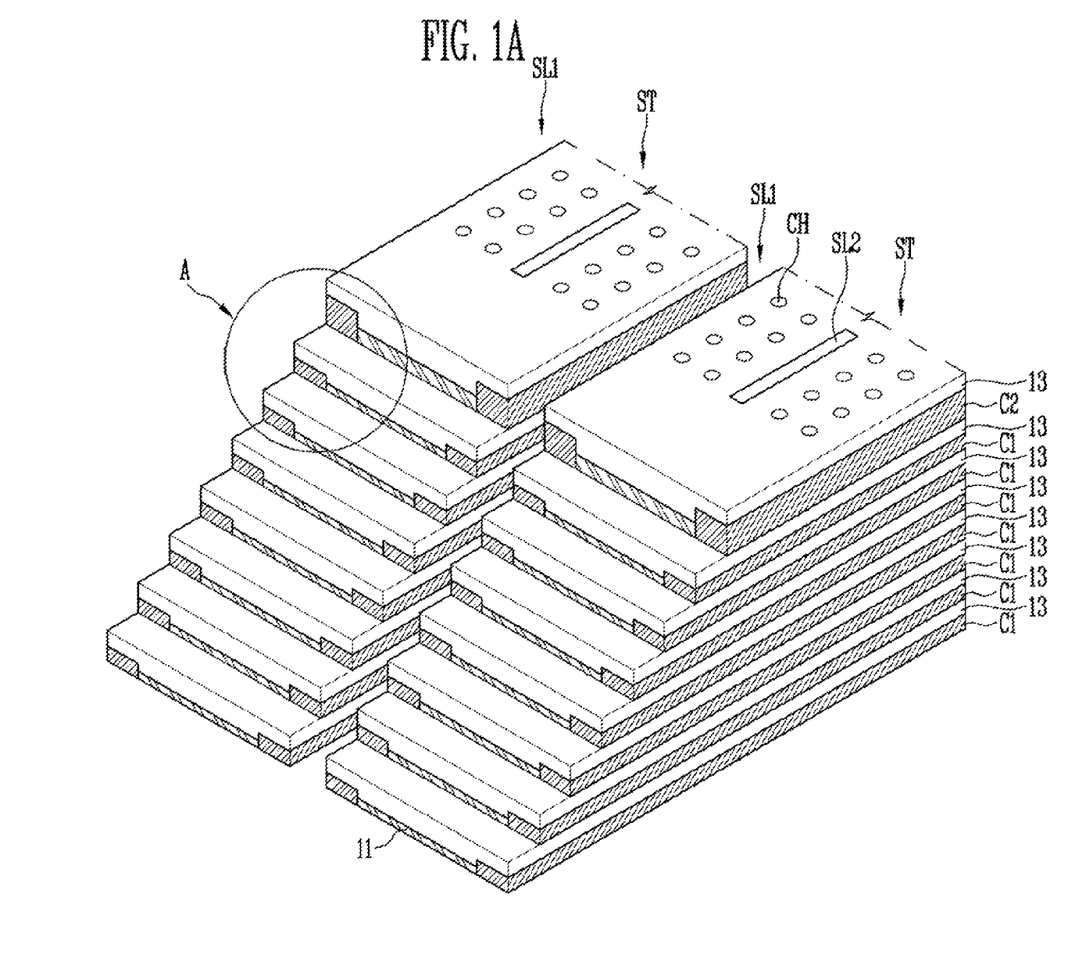
FIG. 1A is a perspective view illustrating a semiconductor device according to an embodiment of the present invention.
Figure 1B:
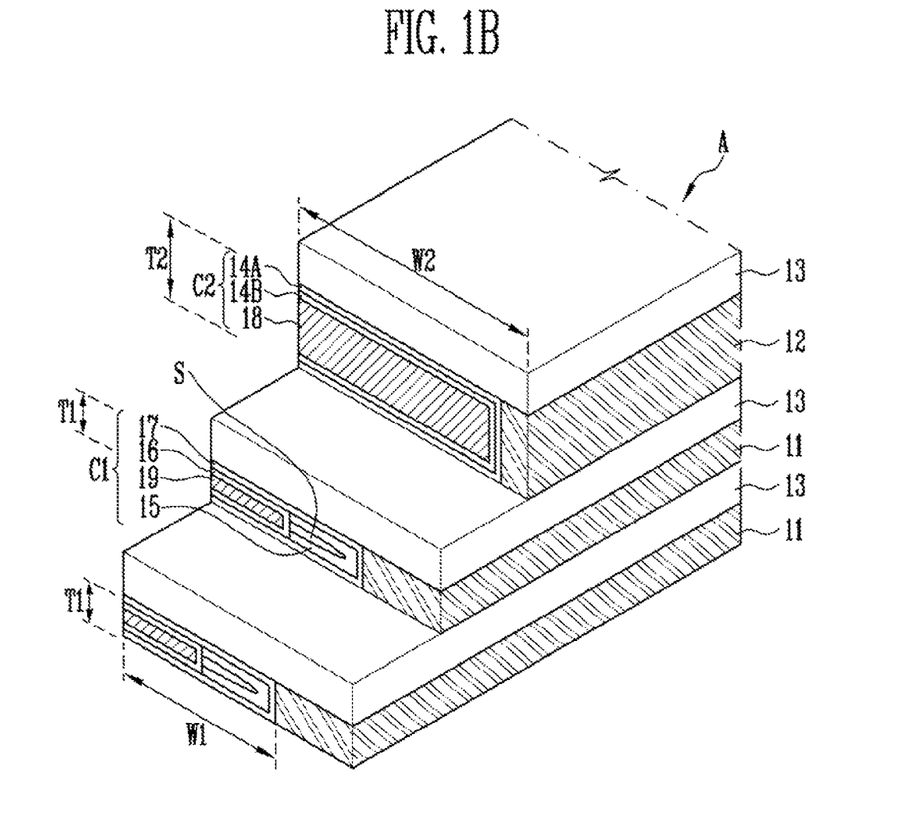
FIG. 1B is a perspective view illustrating an enlarged region A of FIG. 1.

FIG. 1A is a perspective view illustrating semiconductor device according to an embodiment of the present invention. FIG. 1B is a perspective view illustrating an enlarged region A of FIG. 1A.

As illustrated in FIG. 1A, a semiconductor device according to an embodiment may include stacked structures ST. Each of the stacked structures ST may include a plurality of first conductive layers C1 stacked in different planes and at least one second conductive layer C2 formed over or under the first conductive layers C1. For example, the first conductive layers C1 may be gate electrodes of memory cells, and the second conductive layer C2 may be a gate electrode of a selection transistor. Insulating layers 13 may be interposed between the first and second conductive layers C1 and C2. In addition, a sidewall of each of the stacked structures ST may be stepped.

First slits SL1 may be located between the stacked structures ST. Additionally, each of the stacked structures ST may further include sacrificial layers 11 in a central region separated from the first slits SL1. The sacrificial layers 11 may be coupled to the first or second conductive layers C1 and C2. The first and second conductive layers C1 and C2 may be located on the sidewall of the stacked structure ST, exposed through the first slits SL1, i.e., in an edge region thereof, and the sacrificial layers 11 may be located in the central region of the stacked structure ST.

In addition, the semiconductor device may further include at least one second slit SL2 and channel layers CH passing through the stacked structure ST. The first and second slits SL1 and SL2 may be filled with insulating layers.

As illustrated in FIG. 1B, the first conductive layers C1 and the second conductive layer C2 may have different structures. For example, each of the first conductive layers C1 may include a second barrier pattern 17, a sacrificial pattern (or a dummy pattern) 15, a first barrier pattern 16 and a first conductive pattern 19. A seam S may be formed in the sacrificial pattern 15 of each of the first conductive layers C1. In addition, the second conductive layer C2 may include third barrier patterns 14A and 14B and a second conductive pattern 18.

The second conductive layer C2 may have a greater thickness than the first conductive layers C1 (T1<T2). In addition, the second conductive layer C2 may have a greater width than the first conductive layers C1 (W1<W2). For example, a 3-1$^{st}$ barrier pattern 14A may have substantially the same thickness as the second barrier pattern 17, a 3-2$^{nd}$ barrier pattern 14B may have substantially the same thickness as the first barrier pattern 16, and the second conductive pattern 18 may have a greater thickness than the first conductive pattern 19. Here, the phrase "substantially the same" includes a manufacturing error range.

According to the semiconductor device configured' as described above, the first conductive layers C1 and the second conductive layer C2 may have different structures. More specifically, since the first conductive layers C1 and the second conductive layer C2 having different thicknesses are formed by different structures, the first conductive patterns 19 and the second conductive patterns 18 may be formed without voids.

Figure 1C:
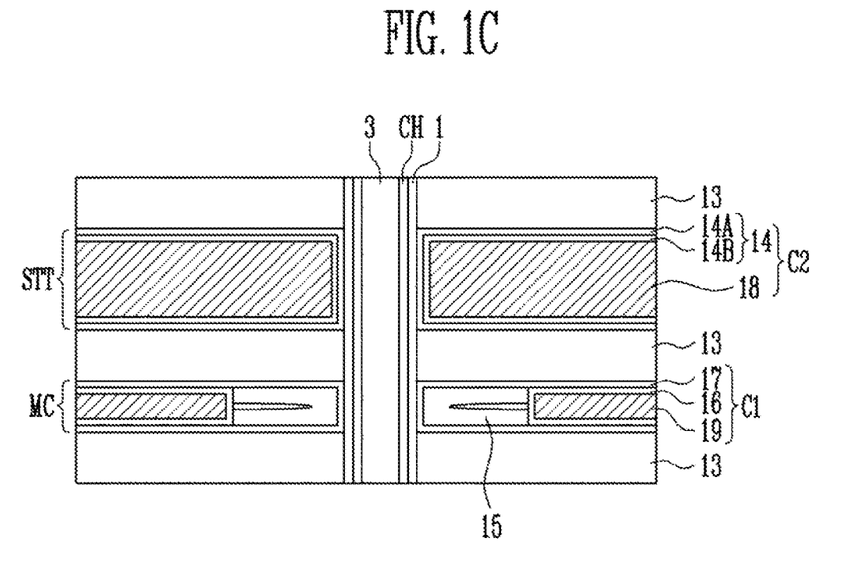
FIG. 1C is a cross-sectional view of a structure illustrating a semiconductor device according to an embodiment of the present invention.

FIG. 1C is a cross-sectional view of a structure illustrating a semiconductor device according to an embodiment of the present invention.

As illustrated in FIG. 1C, each memory cell MC may include the channel layer CH, a memory layer 1, the first conductive pattern 19, the sacrificial pattern 15, the first barrier pattern 16 and the second barrier pattern 17. The sacrificial pattern 15 and the first conductive pattern 19 may have a cylindrical structure surrounding a side all of the channel layer CH. The first conductive pattern 19 may surround the sacrificial pattern 15. That is, the sacrificial pattern 15 may be located in the first conductive pattern 19. The first barrier pattern 16 may surround the first conductive pattern 19 and be partially interposed between the first conductive pattern 19 and the sacrificial pattern 15. The second barrier pattern 17 may surround the sacrificial pattern 15 and be partially interposed between the channel layer CH and the sacrificial pattern 15. For example, the second barrier pattern 17 may extend to surround the first barrier pattern 16. The second barrier pattern 17 may surround the sacrificial' pattern 15 and the first barrier pattern 16 corresponding thereto. In addition, the memory layer 1 may be interposed between the channel layer CH and the second barrier pattern 17. The channel layer CH may include an open central region, a central region completely filled, or a combination thereof. An insulating layer 3 may be formed in the open central' region of the channel layer CH.

A selection transistor STT may include the channel layer CH, the second conductive pattern 18 and the third barrier pattern 14. The second conductive pattern 18 may have a cylindrical structure surrounding the sidewall of the channel layer CH. The third barrier pattern 14 may surround the second conductive pattern 18 and include a 3-1$^{st}$ barrier layer 14A and a 3-2$^{nd}$ barrier layer 14B. In addition, the selection transistor STT may further include a gate insulating layer interposed between the channel layer CH and the third barrier pattern 14. For example, the memory layer 1 may serve as the gate insulating layer of the selection transistor STT.

The semiconductor device configured as described above may include gate electrodes of the selection transistor STT and the memory cell MC having different structures.

FIGS. 2A to 2H are cross-sectional views illustrating a method of manufacturing a semiconductor device according to an embodiment of the present invention.

Figure 2A:
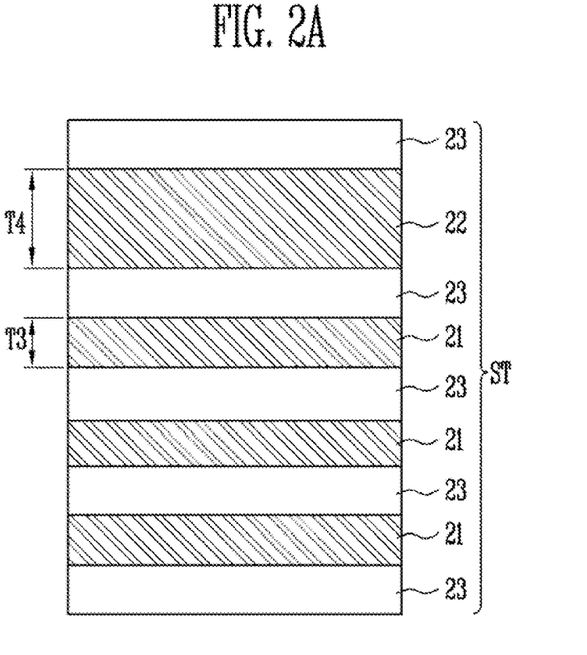
FIGS. 2A to 2H are cross-sectional views of a process flow for illustrating a method of manufacturing a semiconductor device according to an embodiment of the present invention.

As illustrated in FIG. 2A, the stacked structure ST may be formed by stacking first material layers 21 and at least one second material layer 22 and interposing third material' layers 23 between the first and second material layers 21 and 22. For example, after the first material layers 21 and the third material layers 23 are alternately formed, at least one second material layer 22 and at least one third material layer 23 may be alternately formed, so that the stacked structure ST may be formed. FIG. 2A illustrates the second material layer formed over the first material layers 21. However, in another example, the second material layer 22 may be formed under the first material layers 21.

The first and second material layers 21 and 22 may be stacked to form gate electrodes of a selection transistor, a memory cell and the like. For example, the first material layers 21 may be stacked to form gate electrodes of memory cells, and the second material layer 22 may be stacked to form a gate electrode of a selection transistor. In addition, the third material layers 23 may be stacked to form insulating layers that electrically insulate the stacked conductive layers from each other.

The first material layers 21 and the second material layer 22 may include the same or different materials. In addition, the first and second material layers 21 and 22 may include a material having a high etch selectivity with respect to the third material layers 23. For example, the first or second material layer 21 or 22 may include a sacrificial layer including a nitride, and the third material layers 23 may include an insulating layer including an oxide. In another example, the first or second material layers 21 or 22 may include a first sacrificial layer including a nitride, and the third material layers 23 may include a second sacrificial layer including an oxide.

The first material layer 21 and the second material layer 22 may have the same thickness (T3=T4), or the second material layer 22 may have a greater thickness than the first material layer 21 (T3<T4). In addition, the third material' layers 23 and the first material layers 21 may have the same or different thicknesses.

Though not illustrated in FIG. 2A, openings may be formed through the stacked structure ST, and a memory layer and a channel layer may be formed in each of the openings. The memory layer may include at least one of a charge blocking layer, a data storage layer and a tunnel insulating layer. For example, the data storage layer may include at least one of a charge trap layer, such as a nitride layer, a charge storing layer, such as a polysilicon layer, nanodots, or a phase-change material layer. In addition, though not illustrated in FIG. 2A, at least one sidewall of each of the stacked structures ST may be stepped.

Figure 2B:
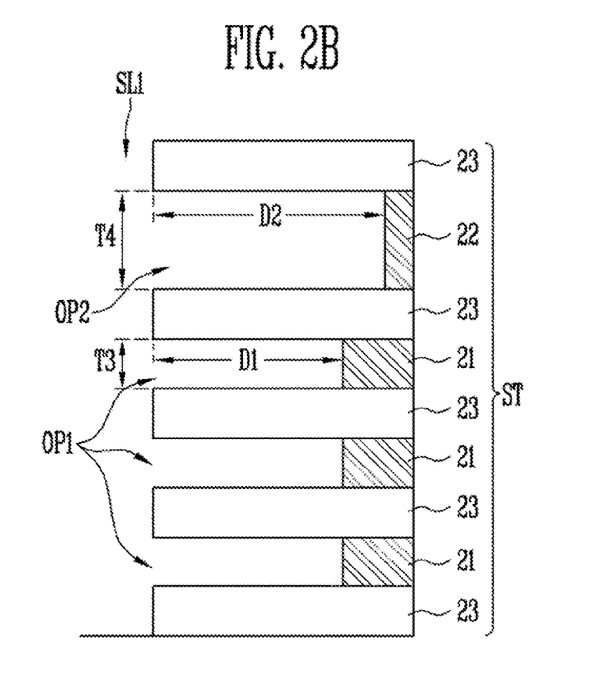

As illustrated in FIG. 2B, a first slit SL1 may be formed through the first to third material layers 21 to 23. Subsequently, the first and second material layers 21 and 22 may be removed through the first slit SL1 to form the first and second openings OP1 and OP2. For example, the first openings OP1 may be formed by removing the first material layers 21, and the second opening OP2 may be formed by removing the second material layer 22.

When the second material layer 22 has a greater thickness than the first material layer 21 (T3<T4), an exposed area of the second material layer 22 may be greater than that of the first material layer 21. As a result, more of the second material layer 22 may be removed than the first material layer 21. Therefore, the second opening OP2 may have a greater thickness than the first opening OP1 (T3<T4) or a greater depth than the first opening OP1 (D1<D2).

Figure 2C:
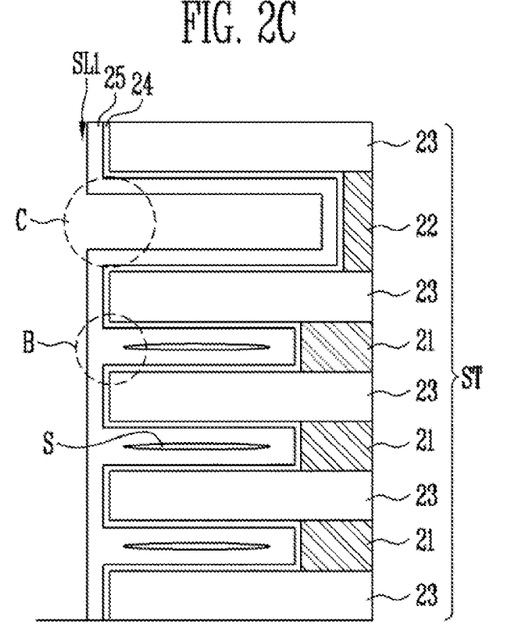

As illustrated in FIG. 2C, a first sacrificial layer 25 may be formed in the first and second openings OP1 and OP2 (shown in FIG. 2B) through the first slit SL1. Before the first sacrificial layer 25 is formed, a first barrier layer 24 may be formed on surfaces of the first slit SL1, the first openings OP1 and the second opening OP2. The first sacrificial layer 25 may include a polysilicon layer or an insulating layer. The first barrier layer 24 may include a titanium layer (Ti), a titanium nitride layer (TiN), tantalum (Ta) and a tantalum nitride layer (TaN).

For example, when the second material layer 22 has a greater thickness than the first material layer 21 (T3<T4), the first sacrificial layer 25 may be formed so that a connecting portion between the second opening OP2 and the first slit SL1 may be opened (C) and a connecting portion between the first openings OP1 and the first slit SL1 may be sealed (B). The first sacrificial layer 25 may include or may not include seams S located in the first openings OP1. For example, the seams S, which are empty spaces, may be formed in the first sacrificial layer 25 if the connection portion between the first openings OP1 and the first slit SL1 is sealed before the first openings OP1 are completely filled when the first sacrificial layer 25 is formed in the first openings OP1.

Figure 2D:
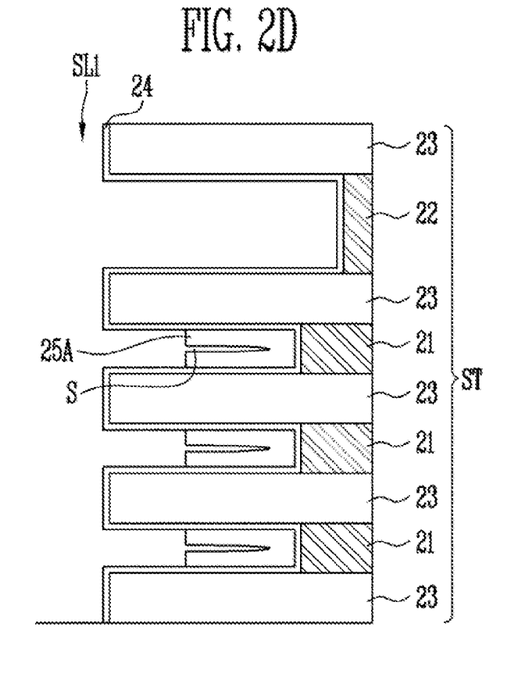

As illustrated in FIG. 2D, the first sacrificial' layer 25 may be partially removed through the first slit SL1 to form first sacrificial patterns 25A in the first openings OP1. For example, the first sacrificial patterns 25A may be formed by completely removing the first sacrificial layer 25 formed in the second opening OP2 and partially removing the first sacrificial layer 25 formed in the first openings OP1.

Since the connection portion between the second opening OP2 and the first slit SL1 is opened, an exposed area of the first sacrificial layer 25 may be relatively large. Therefore, the first sacrificial layer 25 may be completely removed from the second opening OP2. Alternatively, since the connecting portion between the first opening OP1 and the first slit SL1 is sealed, the exposed area of the first sacrificial layer 25 may be relatively small. Therefore, the first sacrificial layer 25 may be partially removed, and the first sacrificial patterns 25A may remain. The first sacrificial layer 25 may be removed by using an ammonia based cleaning process. For example, when a wet etch process is performed using a diluted ammonia (DAM) solution, in which ammonia is diluted between 50:1 and 10:1, at a temperature ranging from 50 to 100° C., it may be easy to control the amount of the first sacrificial layer 25 to be removed from the first openings OP1.

Figure 2E:
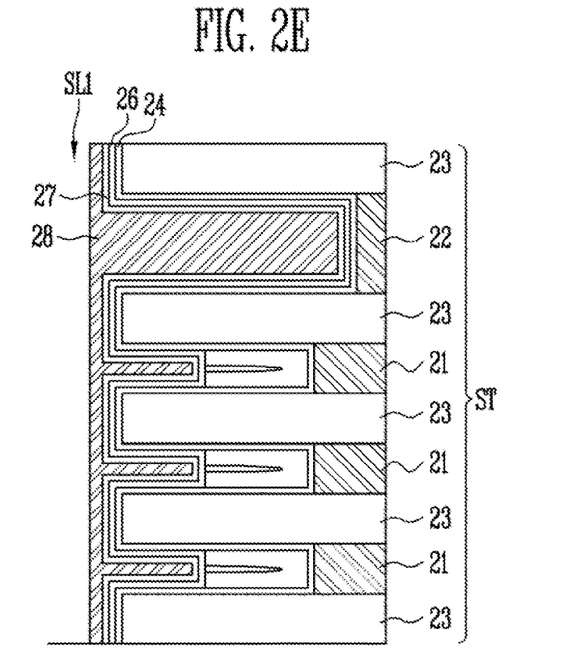

As illustrated in FIG. 2E, a seed layer 27 and a second sacrificial layer 28 may be formed in the first slit SL1, the first openings OP1 and the second opening OP2. For example, after the seed layer 27 is formed on inner surfaces of the first slit SL1, the first openings OP1 and the second opening OP2, the second sacrificial layer 28 may be formed to completely fill the first and second openings OP1 and OP2. The seed layer 27 may include tungsten, and the second sacrificial layer 28 may include a polysilicon layer or an insulating layer.

Before the second sacrificial layer 28 is formed, a second barrier layer 26 may be formed on surfaces of the first slit SL1, the first openings OP1 and the second opening OP2. The second barrier layer 26 may include titanium (Ti), a titanium nitride layer (TiN), tantalum (Ta) and a tantalum nitride layer (TaN).

Figure 2F:
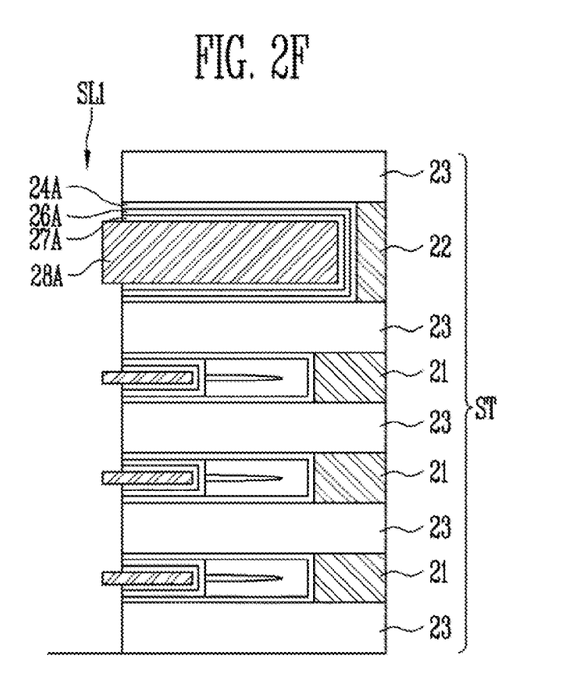

As illustrated in FIG. 2F, the second sacrificial layer 28 may be removed from the first slit SL1. As a result, second sacrificial patterns 28A may be formed in the first and second openings OP1 and OP2, and the seed layer 27, formed in the first slit SL1, may be exposed.

Subsequently, the seed layer 27 may be removed from the first slit SL1. Since the seed layer 27, formed in the first and second openings OP1 and OP2, is protected by the second sacrificial patterns 28A, the seed layer 27 may be selectively removed from the first slit SL1. As a result, seed patterns 27A may be formed in the first and second openings OP1 and OP2.

When the first and second barrier layers 24 and 26 are formed, the first and second barrier layers 24 and 26 may be removed from the first slit SL1. Since the first and second barrier layers 24 and 26 formed in the first and second openings OP1 and OP2 are protected by the second sacrificial patterns 28A, the first and second barrier layers 24 and 26 may be selectively removed from the first slit SL1. Therefore, first and second barrier patterns 24A and 26A may be formed in the first and second openings OP1 and OP2.

Figure 2G:
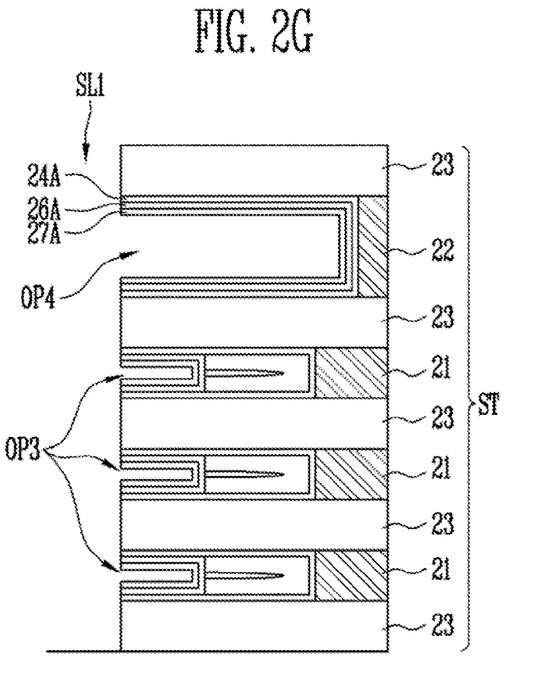

As illustrated in FIG. 2G, the second sacrificial patterns 28A may be removed through the first slit SL1 to form third and fourth openings OP3 and OP4. As a result, the seed patterns 27A may be exposed through the third and fourth openings OP3 and OP4.

Figure 2H:
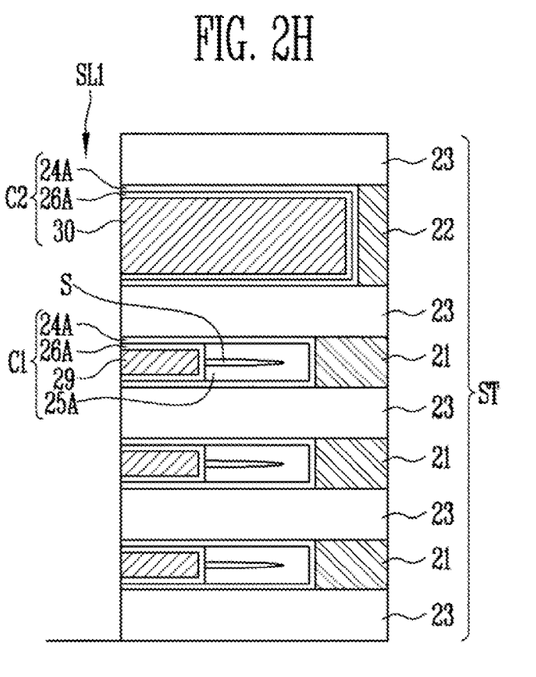

As illustrated in FIG. 2H, first and second conductive patterns 29 and 30 may be formed in the third and fourth openings OP3 and OP4. For example, conductive layers may be grown from the seed patterns 27A by using an epitaxial growth process, so that the first and second conductive patterns 29 and 30 may be formed. As a result, the first conductive layers C1 may include the first conductive patterns 29, and the second conductive layer C2 may include the second conductive pattern 30.

Though not illustrated in FIG. 2H, an insulating layer may be formed in the first slit SL1. In addition, when the first material layers 21 are first sacrificial layers and the second material layer 22 is a second sacrificial layer, openings may be formed by removing the second material layer 22, a memory layer exposed through the openings may be etched and patterned in units of memory cells, and insulating layers may be formed in the openings.

According to the above-described processes, since the first and second conductive patterns 29 and 30 are formed by growing conductive layers from the seed patterns 27A, the first and second conductive patterns 29 and 30 may be formed in the third and fourth openings OP3 OP4 without seams.

Additionally, even when the seams S are formed in the first conductive patterns 29, reaction gas used to form the sacrificial patterns 25A may remain in the seams S. Unlike reaction gas used to form the first and second conductive patterns 29 and 30, the reaction gas used to form the sacrificial patterns 25A may not damage neighboring layers even when the reaction gas remains in the seams S. Therefore, deterioration of characteristics of the semiconductor device caused by damage to neighboring layers may be prevented.

Figure 3:
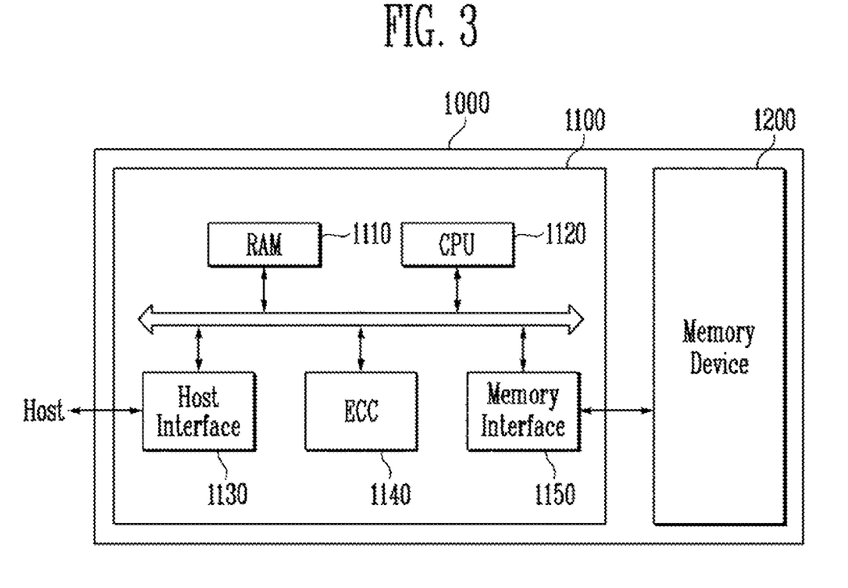
FIG. 3 is a block diagram illustrating the configuration of a memory system according to an embodiment of the present invention.

FIG. 3 is a block diagram illustrating the configuration of a memory system according to an embodiment of the present invention.

As illustrated in FIG. 3, a memory system 1000 according to an embodiment of the present invention may include a memory device 1200 and a controller 1100.

The memory device 1200 may be used to store various data types such as text, graphic and software code. The memory device 1200 may be a non-volatile memory and include the memory string described above with reference to FIGS. 1A to 2H. In addition, the memory device 1200 may include a plurality of first conductive patterns stacked over a substrate, sacrificial patterns included in the first conductive patterns, first barrier patterns surrounding the first conductive patterns and partially interposed between the first conductive patterns and the sacrificial patterns; second barrier patterns surrounding the first barrier patterns and the sacrificial patterns corresponding thereto; at least one second conductive pattern located over or under the first conductive patterns; and at least one third barrier pattern surrounding at least one second conductive pattern, in which the second conductive pattern has a greater thickness than the first conductive patterns. Since the memory device 1200 is formed and manufactured in the above-described manner, a detailed description thereof will be omitted.

The controller 1100 may be coupled to a host and the memory device 1200, and may access the memory device 1200 in response to a request from the host. For example, the controller 1100 may control read, write, erase and background operations of the memory device 1200.

The controller 1100 may include a random access memory (RAM) 1110, a central processing unit (CPU) 1120, a host interface 1130, an error correction code (ECC) circuit 1140 and a memory interface 1150.

The RAM 1110 may function as an operation memory of the CPU 1120, a cache memory between the memory device 1200 and the host, and a buffer memory between the memory device 1200 and the host. The RAM 1110 may be replaced by a static random access memory (SRAM) or a read only memory (ROM).

The CPU 1120 may be suitable for controlling overall operations of the controller 1100. For example, the CPU 1120 may be suitable for operating firmware such as an FTL (Flash Translation Layer) stored in the RAM 1110.

The host interface 1130 may interface with the host. For example, the controller 1100 may communicate with the host through one of various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol and a private protocol.

The ECC circuit 1140 may detect and correct errors included in data read from the memory device 1200 by using error correction codes (ECGs).

The memory interface 1150 may interface with the memory device 1200. For example, the memory interface 1150 may include a NAND interface or a NOR interface.

Additionally, the controller 1100 may further include a buffer memory (not illustrated) configured to temporarily store data. The buffer memory may temporarily store data, externally transferred through the host interface 1130, or temporarily store data transferred from the memory device 1200 through the memory interface 1150. In addition, the controller 1100 may further include ROM storing code data to interface with the host.

Since the memory system 1000 according to an embodiment of the present invention includes a memory device 1200 having an increased degree of integration, the degree of integration of the memory system 1000 may also be increased.

Figure 4:
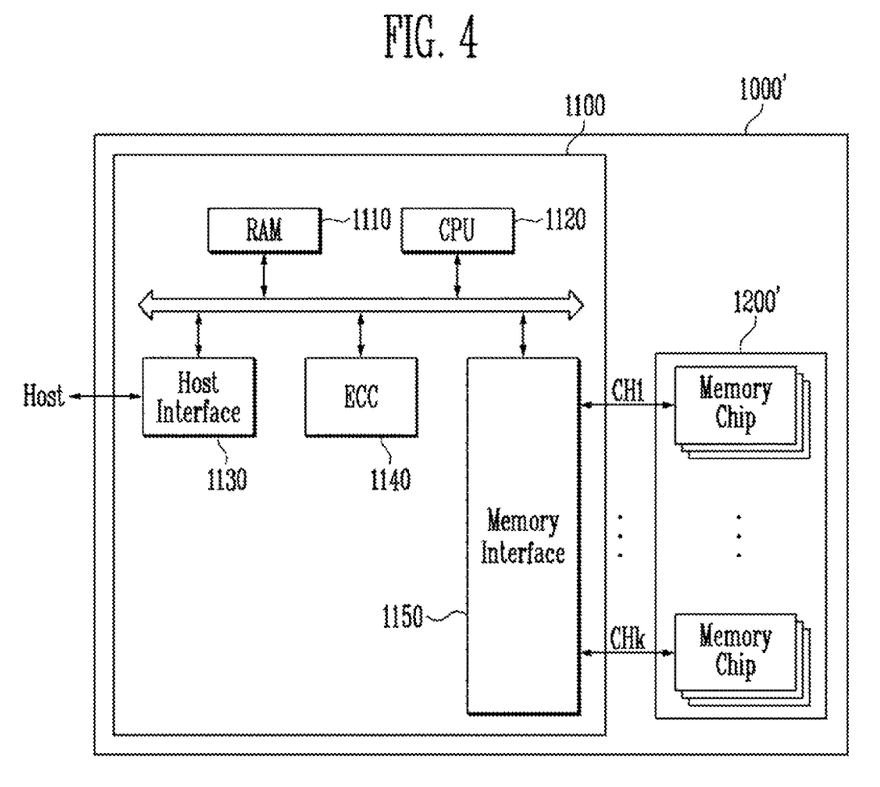
FIG. 4 is a block diagram illustrating the configuration of a memory system according to an embodiment of the present invention.

FIG. 4 is a block diagram illustrating the configuration of a memory system according to an embodiment of the present invention. Hereinafter, a description of common contents with the earlier described embodiment is omitted.

As illustrated in FIG. 4, a memory system 1000' according to an embodiment of the present invention may include a memory device 1200' and the controller 1100. In addition, the controller 1100 may include the RAM 1110, the CPU 1120, the host interface 1130, the ECC circuit 1140 and the memory interface 1150.

The memory device 1200' may be a non-volatile memory device. The memory device 1200' may be the semiconductor device described above with reference to FIGS. 1A to 2H. In addition, the memory device 1200' may include a first stacked structure including first conductive layers and first insulating layers formed alternately with each other, first semiconductor patterns passing through the first stacked structure, a coupling pattern coupled to the first semiconductor patterns, and a slit passing through the first stacked structure and the coupling pattern. Since the memory device 1200' is formed and manufactured in the above-described manufacturing method, a detailed description thereof will be omitted.

In addition, the memory device 1200' may be a multi-chip package composed of a plurality of memory chips. The plurality of memory chips may be divided into a plurality of groups. The plurality of groups may communicate with the controller 1100 through first to k-th channels CH1 to CHk. In addition, memory chips included in a single group may be suitable for communicating with the controller 1100 through a common channel. The memory system 1000' may be modified so that a single memory chip may be coupled to a single channel.

As described above, according to an embodiment of the present invention, since the memory system 1000' includes the memory device 1200' having improved characteristics of, for example, a cell current, characteristics of the memory system 1000' may also be improved. In addition, data storage capacity and driving speed of the memory system 1000' may be further increased by forming the memory device 1200' using a multi-chip package.

Figure 5:
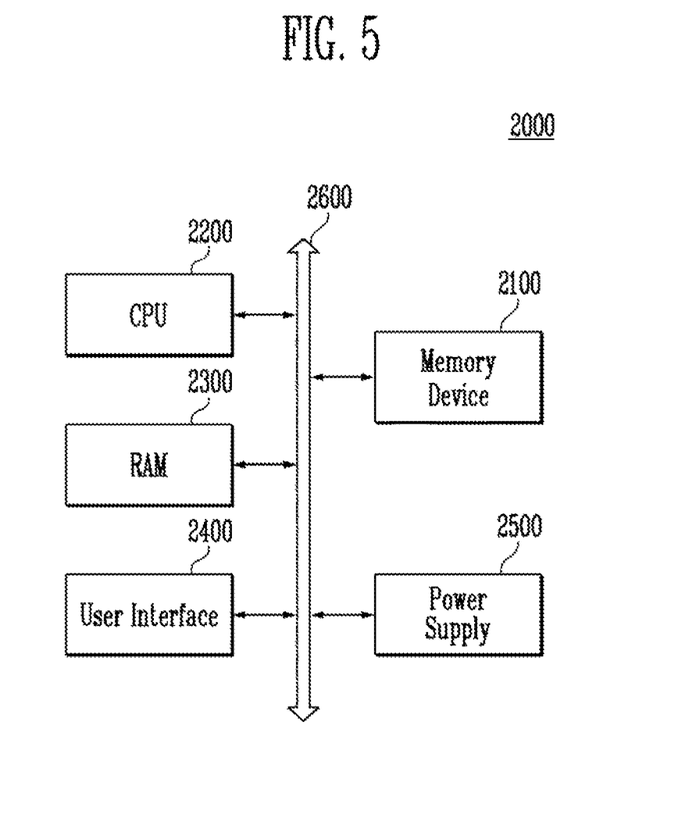
FIG. 5 is a block diagram illustrating the configuration of a computing system according to an embodiment of the present invention.

FIG. 5 is a block diagram illustrating the configuration of a computing system according to an exemplary embodiment of the present invention. A further description of contents in common with the earlier described embodiments is omitted.

As illustrated in FIG. 5, a computing system 2000 according to an embodiment of the present invention may include a memory device 2100, a CPU 2200, a random-access memory (RAM) 2300, a user interface 2400, a power supply 2500 and a system bus 2600.

The memory device 2100 may store data, which is input through the user interface 2400, and data which is processed by the CPU 2200. In addition, the memory device 2100 may be electrically coupled to the CPU 2200, the RAM 2300, the user interface 2400 and the power supply 2500. For example, the memory device 2100 may be coupled to the system bus 2600 through a controller (not illustrated) or be directly coupled to the system bus 2600. When the memory device 2100 is directly coupled to the system bus 2600, functions of the controller may be performed by the CPU 2200 and the RAM 2300.

The memory device 2100 may be non-volatile memory. In addition, the memory device 2100 may be the semiconductor memory device described above with reference to FIGS. 1A to 2H. The memory device 2100 may include a plurality of first conductive patterns stacked over a substrate, sacrificial patterns included in the first conductive patterns, first barrier patterns surrounding the first conductive patterns and partially interposed between the first conductive patterns and the sacrificial patterns; second barrier patterns surrounding the first barrier patterns and the sacrificial patterns corresponding thereto; at least one second conductive pattern located over or under the first conductive patterns; and at least one third barrier pattern surrounding at least one second conductive pattern, in which the second conductive pattern has a greater thickness than the first conductive patterns. Since the memory device 2100 is formed and manufactured in the above-described manner, a detailed description thereof will be omitted.

In addition, as described above with reference to FIG. 4, the memory device 2100 may be a multi-chip package composed of a plurality of memory chips.

The computing system 2000 having the above-described configuration may be one of various components of an electronic device, such as a computer, an ultra mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device, and/or one of various devices for computing systems, etc.

As described above, since the computing system 2000 according to an embodiment of the present invention includes a memory device 2100 having an increased degree of integration, the degree of integration of the computing system 2000 may be increased accordingly.

Figure 6:
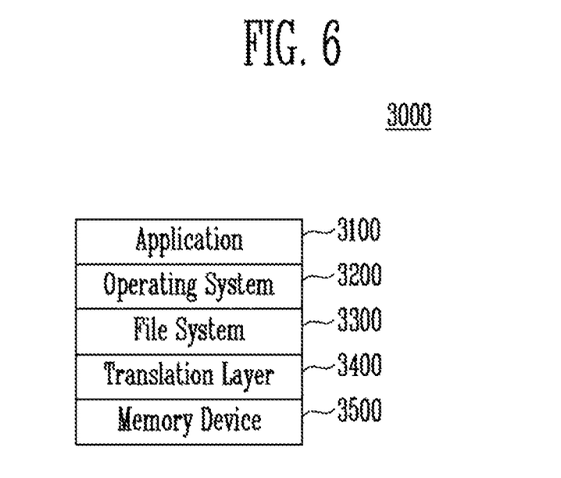
FIG. 6 is a block diagram illustrating a computing system according to an embodiment of the present invention.

FIG. 6 is a block diagram of a computing system according to an embodiment of the present invention.

As illustrated in FIG. 6, a computing system 3000 according to an embodiment of the present invention may include a software layer that has an operating system 3200, an application 3100, a file system 3300 and a translation layer 3400. In addition, the computing system 3000 may include a hardware layer such as a memory system 3500.

The operating system 3200 manages software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data to be stored in the memory device 3500 according to rules. The file system 3300 may be determined depending on the operating system 3200 that is used in the computing system 3000. For example, when the operating system 3200 is a Microsoft Windows-based system, the file system 3300 may be a file allocation table (FAT) or an NT file system (NTFS). In addition, when the operating system 3200 is a Unix/Linux-based system, the file system 3300 may be an extended file system (EXT), a Unix file system (UFS) or a journaling file system (JFS).

FIG. 6 illustrates the operating system 3200, the application 3100, and the file system 3300 in separate blocks. However, the application 3100 and the file system 3300 may be included in the operating system 3200.

The translation layer 3400 may translate an address to be suitable for the memory device 3500 in response to a request from the file system 3300. For example, the translation layer 3400 may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL) or the like.

The memory device 3500 may be a non-volatile memory. The memory device 3500 may be the semiconductor memory device described above with reference to FIGS. 1A to 2H. In addition, the memory device 3500 may include a plurality of first conductive patterns stacked over a substrate, sacrificial patterns included in the first conductive patterns, first barrier patterns surrounding the first conductive patterns and partially interposed between the first conductive patterns and the sacrificial patterns; second barrier patterns surrounding the first barrier patterns and the sacrificial patterns corresponding thereto; at least one second conductive pattern located over or under the first conductive patterns; and at least one third barrier pattern surrounding at least one second conductive pattern, in which the second conductive pattern has a greater thickness than the first conductive patterns. Since the memory device 3500 is formed and manufactured in the above-described manner, a detailed description thereof will be omitted.

The computing system 3000 having the above-described configuration may be divided into an operating system layer that is operated in an upper layer region and a controller layer that is operated in a lower level region. The application 3100, the operating system 3200 and the file system 3300 may be included in the operating system layer and driven by an operation memory. In addition, the translation layer 3400 may be included in the operating system layer or the controller layer.

As described above, since the computing system 3000 according to an embodiment of the present invention includes the memory device 3500 having an increased degree of integration, data storage capacity of the computing system 3000 may be improved.

According to the embodiments of the present invention, it may be easier to form a stacked structure in which conductive layers having different structures are stacked. In addition, the stacked conductive layers may be easily separated, and neighboring layers may be prevented from being damaged.

As described above, the exemplary embodiments have been disclosed in the drawings and the specification. The specific terms used herein are for purposes of illustration and do not limit the scope of the present invention defined in the claims. Those skilled in the art will appreciate that various modifications and other equivalent examples may be made without departing from the scope and spirit of the present disclosure. Therefore, the sole scope of technical protection of the present invention will be defined by the spirit of the accompanying claims.

What is claimed is:

1. A semiconductor device, comprising:
a plurality of first conductive patterns stacked over a substrate;
dummy patterns formed in the first conductive patterns, respectively;
first barrier patterns each surrounding the respective first conductive patterns and partially interposed between the respective first conductive patterns and the respective dummy patterns;
second barrier patterns each surrounding the respective first barrier patterns and the respective dummy patterns;
a second conductive pattern located over or under the first conductive patterns; and
a third barrier pattern surrounding the second conductive pattern,
wherein the second conductive pattern has a greater thickness than the first conductive patterns.

2. The semiconductor device of claim 1, wherein the second conductive pattern has a greater width than the first conductive patterns.

3. The semiconductor device of claim 1, wherein each of the dummy patterns includes a seam therein.

4. The semiconductor device of claim 1, wherein the first and second conductive patterns include tungsten, and the dummy patterns include polysilicon or an insulating material.

5. The semiconductor device of claim 1, wherein the first conductive patterns are gate electrodes of memory cells, and the second conductive pattern is a gate electrode of a selection transistor.

6. A semiconductor device, comprising:
a memory cell including a first channel layer, a dummy pattern surrounding a sidewall of the first channel layer, a first conductive pattern surrounding the dummy pattern, a first barrier pattern surrounding the first conductive pattern and partially interposed between the first conductive pattern and the dummy pattern, and a second barrier pattern surrounding the first barrier pattern and the dummy pattern; and
a selection transistor located over or under the memory cell and including a second channel layer, a second conductive pattern surrounding a sidewall of the second channel layer, and a third barrier pattern surrounding the second conductive pattern.

7. The semiconductor device of claim 6, wherein the second conductive pattern has a greater thickness than the first conductive pattern.

* * * * *